United States Patent
Nakanishi

(10) Patent No.: US 8,294,363 B2
(45) Date of Patent: Oct. 23, 2012

(54) LIGHT-EMITTING DEVICE WITH IMPROVED BRIGHTNESS CONTROL AND NARROW FRAME AND ELECTRONIC APPARATUS WITH THE LIGHT-EMITTING DEVICE

(75) Inventor: Hayato Nakanishi, Toyama (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/079,345

(22) Filed: Apr. 4, 2011

(65) Prior Publication Data
US 2011/0186903 A1 Aug. 4, 2011

Related U.S. Application Data

(63) Continuation of application No. 12/432,463, filed on Apr. 29, 2009, now Pat. No. 7,944,142, and a continuation of application No. 11/979,207, filed on Oct. 31, 2007, now Pat. No. 7,932,672, and a continuation of application No. 11/403,933, filed on Apr. 14, 2006, now Pat. No. 7,309,959, and a continuation of application No. 10/445,190, filed on May 27, 2003, now Pat. No. 7,053,548.

(30) Foreign Application Priority Data

| May 28, 2002 | (JP) | 2002-154609 |
|---|---|---|
| May 28, 2002 | (JP) | 2002-154610 |
| May 28, 2002 | (JP) | 2002-154611 |
| May 28, 2002 | (JP) | 2002-154612 |
| May 22, 2003 | (JP) | 2003-145431 |

(51) Int. Cl.
*H05B 33/04* (2006.01)
*H05B 33/00* (2006.01)

(52) U.S. Cl. .......... 313/506; 313/500; 313/512; 257/72; 257/79

(58) Field of Classification Search ................ None
See application file for complete search history.

(56) References Cited

U.S. PATENT DOCUMENTS

| 6,124,604 | A | 9/2000 | Koyama et al. |
|---|---|---|---|
| 6,303,963 | B1 | 10/2001 | Ohtani et al. |
| 6,359,606 | B1 | 3/2002 | Yudasaka |
| 6,483,493 | B2 * | 11/2002 | Murade ................ 345/87 |
| 6,531,815 | B1 | 3/2003 | Okuyama et al. |

(Continued)

FOREIGN PATENT DOCUMENTS
CN 2621383 Y 6/2004
(Continued)

OTHER PUBLICATIONS

Dec. 31, 2009 Office Action issued in U.S. Appl. No. 11/979,207.

(Continued)

*Primary Examiner* — Sikha Roy
(74) *Attorney, Agent, or Firm* — Oliff & Berrdige, PLC

(57) ABSTRACT

The invention provides a light-emitting device and an electronic apparatus, which are capable of preventing reduction of the amount of current flowing through light-emitting elements and which have an excellent display characteristic. Cathode wiring lines connected to a cathode are provided to surround an effective area outside the effective area where a plurality of pixels having light-emitting elements are provided. First to third power source lines connected to pixel electrodes are provided between the cathode wiring lines and the effective area.

5 Claims, 6 Drawing Sheets

U.S. PATENT DOCUMENTS

| | | |
|---|---|---|
| 6,690,110 B1 | 2/2004 | Yamada et al. |
| 6,717,069 B2 | 4/2004 | Yoneda |
| 6,762,562 B2 | 7/2004 | Leong |
| 6,815,903 B2 | 11/2004 | Nakanishi |
| 6,825,820 B2 | 11/2004 | Yamazaki et al. |
| 7,019,718 B2 | 3/2006 | Yamazaki et al. |
| 7,053,548 B2 | 5/2006 | Nakanishi |
| 7,187,006 B2 * | 3/2007 | Hayashi .................. 257/72 |
| 2002/0011975 A1 | 1/2002 | Yamazaki et al. |
| 2002/0047120 A1 | 4/2002 | Inukai |
| 2002/0104995 A1 | 8/2002 | Yamazaki et al. |
| 2002/0197392 A1 * | 12/2002 | Endo et al. .................. 427/66 |
| 2003/0168966 A1 | 9/2003 | Kobayashi et al. |
| 2004/0012550 A1 | 1/2004 | Koyama |
| 2004/0140472 A1 | 7/2004 | Fujimoto et al. |
| 2004/0183431 A1 | 9/2004 | Hirayama et al. |

FOREIGN PATENT DOCUMENTS

| | | |
|---|---|---|
| JP | A-05-003080 | 1/1993 |
| JP | A-10-198285 | 7/1998 |
| JP | A-2001-102169 | 4/2001 |
| JP | A-2001-109395 | 4/2001 |
| JP | A-2002-110343 | 4/2002 |
| JP | A-2002-151276 | 4/2002 |
| JP | A-2002-108285 | 5/2002 |
| JP | A-2003-330387 | 11/2003 |
| JP | A-2002-141168 | 9/2005 |
| KR | P2000-0010410 | 2/2000 |

OTHER PUBLICATIONS

May 13, 2010 Office Action issued in U.S. Appl. No. 11/979,207.
Aug. 27, 2010 Office Action issued in U.S. Appl. No. 11/979,207.

* cited by examiner

STRIPE

MOSAIC

DELTA

LIGHT-EMITTING DEVICE WITH IMPROVED BRIGHTNESS CONTROL AND NARROW FRAME AND ELECTRONIC APPARATUS WITH THE LIGHT-EMITTING DEVICE

This is a Continuation of application Ser. No. 12/432,463, filed Apr. 29, 2009, which in turn is a Continuation of application Ser. No. 11/979,207, filed Oct. 31, 2007, which in turn is a Continuation of application Ser. No. 11/403,933 filed Apr. 14, 2006, which in turn is a Continuation of application Ser. No. 10/445,190 filed May 27, 2003. The disclosures of the prior applications are hereby incorporated by reference herein in their entirety.

BACKGROUND OF THE INVENTION

1. Field of Invention

The present invention relates to a light-emitting device and an electronic apparatus using the same.

2. Description of Related Art

Related art organic electroluminescence (EL) display devices having light-emitting elements using an organic-light-emitting material between a substrate, in which pixel electrodes are formed, and a counter electrode, are disclosed in Gazette of Japanese Unexamined Patent Application Publication No. 5-3080.

In the organic EL display devices, the light-emitting elements emit light by supplying current to the light-emitting elements. At that time, the brightness of the light-emitting element is determined by the amount of current basically supplied thereto.

It is necessary to accurately set the amount of current to have a desired value because the brightness of such light-emitting elements is basically determined by the amount of supplied current.

In order to secure a sufficient amount of current, the width of wiring lines to supply current increases. Accordingly, a frame area increases. Therefore, it is difficult to mount light-emitting elements on various electronic apparatuses.

SUMMARY OF THE INVENTION

In view of the above and/or other difficulties, the present invention secures a sufficient amount of current or prevents a change in the brightness of the light-emitting element due to change in power source voltage. The present invention also provides a light-emitting device and an electronic apparatus capable of satisfying the above necessities and of narrowing the frame.

A first light-emitting device according to the present invention includes a plurality of pixels, which are provided in an effective area on a substrate, including light-emitting elements having light-emitting layers interposed between first electrodes and a second electrode; and electrode wiring lines connected to the second electrode outside the effective area. The electrode wiring lines are extended along at least one side among a plurality of sides forming the outer periphery of the substrate and a plurality of sides forming the outer periphery of the effective area.

Because the electrode wiring lines are extended along at least one side among a plurality of sides forming the outer circumference of the substrate, it is possible to secure sufficient area where the second electrode contacts the electrode wiring lines.

A second light-emitting device includes a plurality of pixels, which are provided in an effective area on a substrate, including light-emitting elements having light-emitting layers interposed between first electrodes and a second electrode; and electrode wiring lines connected to the second electrode outside the effective area. The electrode wiring lines are provided in the effective area rather than in the outer circumference of the second electrode.

According to the above light-emitting device, it is possible to secure sufficient area where the second electrode contacts the electrode wiring lines line and to narrow a frame.

A third light-emitting device includes a plurality of pixels, which are provided in an effective area on a substrate, including light-emitting elements having light-emitting layers interposed between first electrodes and second electrode, electrode wiring lines connected to the second electrode outside the effective area, and a circuit disposed outside the effective area for supplying electrical signals to the plurality of pixels. The second electrode is formed to cover the effective area and the circuit.

According to the above light-emitting device, it is possible to reduce or prevent the exposure of the light-emitting element and the circuit to air and deterioration by water or oxygen in the air. Also, it is possible to shield light from the second electrode and to reduce or prevent malfunction of the circuit due to light leakage. Also, it is possible to reduce or remove charges injected from the outside by, for example, static electricity through the second electrode.

A fourth light-emitting device includes a plurality of pixels, which are provided in an effective area on a substrate, including light-emitting elements having light-emitting layers interposed between first electrodes and a second electrode; electrode wiring lines connected to the second electrode outside the effective area; and power source lines connected to the first electrodes outside the effective area through effective area power source lines provided in the effective area. The power source lines are provided to be closer to the effective area than the electrode wiring lines.

According to the above light-emitting device, it is possible to reduce risk, such as breaking of wiring, because it is possible to reduce a portion where the electrode wiring lines crosses the power source lines.

Also, so called effective area power source lines specifically correspond to, for example, display power source lines discussed below.

A fifth light-emitting device includes a plurality of pixels, which are provided in an effective area on a substrate, including light-emitting elements having light-emitting layers interposed between first electrodes and a second electrode; electrode wiring lines connected to the second electrode outside the effective area; and power source lines connected to the first electrodes outside the effective area through effective area power source lines provided in the effective area. The second electrode covers at least some of the power source lines and the electrode wiring lines.

It is possible to form capacity between the second electrode and the power source lines or between the second electrode and the electrode wiring line because the second electrode and at least some of the power source lines and the electrode wiring lines overlap each other. Accordingly, even though voltage of the power source lines or voltage of the electrode wiring lines changes, it is possible to reduce the change by a corresponding capacity and to reduce or suppress a change in the brightness of the light-emitting element due to the change in the voltage of the power source lines or the voltage of the electrode wiring lines.

A sixth light-emitting device includes a plurality of pixels, which are provided in an effective area on a substrate, including light-emitting elements having light-emitting layers interposed between first electrodes and a second electrode; electrode wiring lines connected to the second electrode outside the effective area; and power source lines connected to the first electrodes outside the effective area through effective area power source lines provided in the effective area. The power source lines are formed of a plurality of wiring layers blocked by an interlayer insulating film and a conductive material electrically connecting the plurality of wiring layers to each other.

Accordingly, it is possible to reduce breaking of wiring in the power source lines.

The above light-emitting device further includes a sealing member covering the second electrode. The sealing member is preferably connected to a connection portion on the substrate. At least some of the electrode wiring lines preferably overlaps the connection portion. It is possible to narrow the frame by effectively using the space of the connection portion.

According to the above light-emitting device, it is preferable that the substrate is rectangular and that the electrode wiring lines are arranged between three sides among four sides forming the outer circumference of the substrate and the effective area.

It is possible to secure sufficient area where the electrode wiring lines are electrically connected to the second electrode because the electrode wiring lines are provided around the effective area.

Furthermore, it is possible to reduce or prevent voltage drop caused by dragging wiring because it is possible to significantly reduce the wiring lines distance between the plurality of pixels and the electrode wiring lines.

According to the above light-emitting device, scanning lines to supply scanning signal to the plurality of pixels and data lines to supply data signal to the plurality of pixels are preferably provided in the effective area. The electrode wiring lines are preferably formed of the same material as either the material of the scanning lines or the material of the data lines. The electrode wiring lines are preferably formed of the same process as either the process of forming the scanning lines or the process of forming the data lines.

According to the light-emitting device, the electrode wiring lines are preferably formed of a plurality of wiring layers blocked by an interlayer insulating film and a conductive material electrically connecting the plurality of wiring layers to each other.

The light-emitting device preferably comprises a sealing member covering the second electrode. The sealing member is preferably connected to a connection portion on the substrate. At least some of the power source lines preferably overlaps the connection portion.

According to the above light-emitting device, preferably, the first electrode is a pixel electrode and the second electrode is a common electrode provided above the pixel electrode.

According to the above light-emitting device, preferably, the first electrode is an anode and the second electrode is a cathode.

According to the above light-emitting device, the area occupied by a connection portion where the electrode wiring lines are connected to the second electrode is preferably at least 50% of the area of the electrode wiring lines.

An electronic apparatus according to the present invention includes the above light-emitting devices.

The electronic apparatus has an excellent display characteristic because the electronic apparatus has the above light-emitting devices.

BRIEF DESCRIPTION OF THE DRAWINGS

FIG. 5A shows a striped arrangement, FIG. 5B shows a mosaic arrangement, and FIG. 5C shows a delta arrangement;

DETAILED DESCRIPTION OF PREFERRED EMBODIMENTS

An exemplary embodiment of a light-emitting device according to the present invention is described below.

Figure 4:
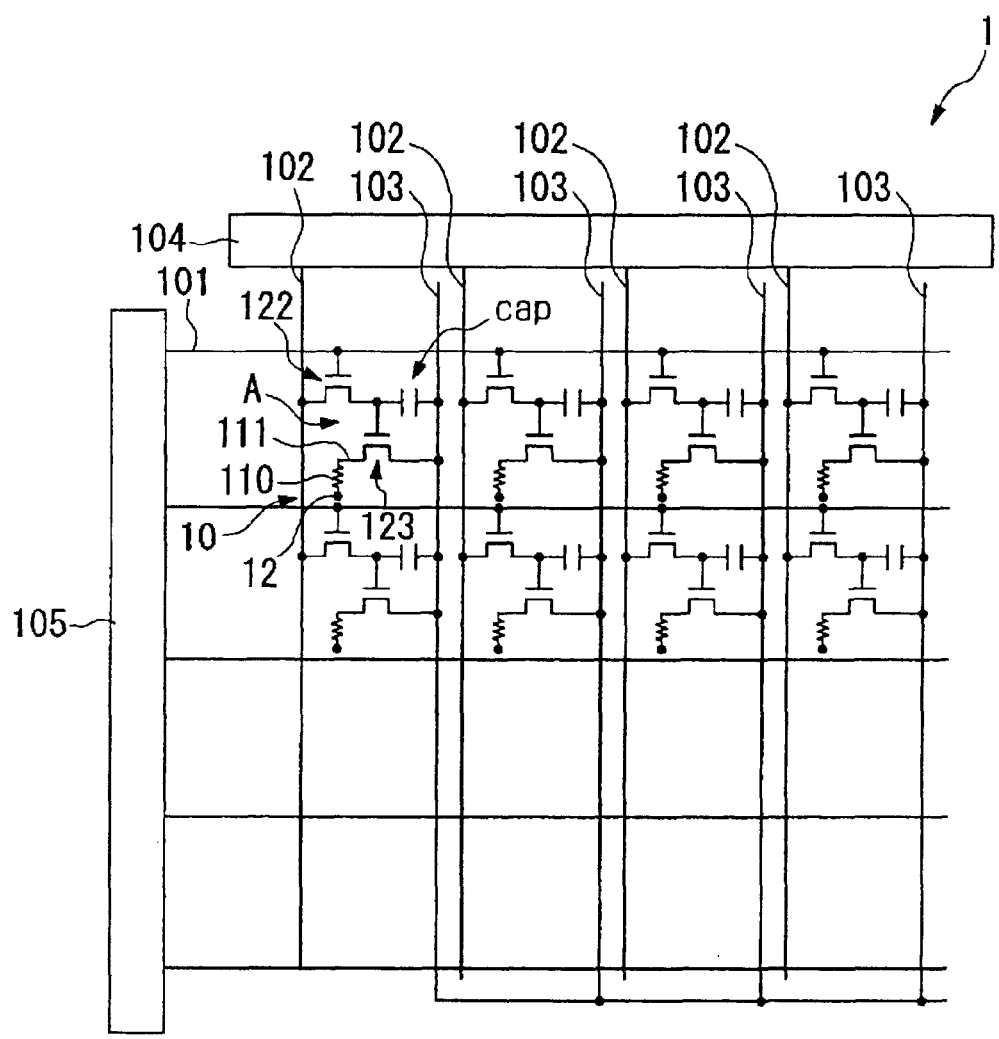
FIG. 4 is a schematic plan view of a wiring lines structure of the light-emitting device shown in FIG. 1.

As shown in FIG. 4, in a light-emitting device 1 according to the present exemplary embodiment, a plurality of scanning lines 101, a plurality of data lines 102 extended to a direction crossing the scanning lines 101 and a plurality of display power source lines 103 extended in parallel for the data lines 102 are wired respectively.

Pixel areas A are formed in portions where the scanning lines 101 cross the data lines 102.

A data driving circuit 104 having a shift register, a level shifter, a video line and an analog switch is connected to the data lines 102. A scan driving circuit 105 having the shift register and the level shifter is connected to the scanning lines 101.

Each pixel area A includes a switching thin film transistor 122 to supply scanning signal to a gate electrode through the scanning lines 101, a storage capacitor cap to store pixel signal supplied from the data lines 102 through the switching thin film transistor 122, and a driving thin film transistor 123 to supply the pixel signal stored by the corresponding storage capacitor cap to the gate electrode. Driving current is supplied from the display power source lines 103 when light-emitting elements 110 are electrically connected to the display power source lines 103 through the driving thin film transistors 123. Accordingly, the light-emitting elements 110 emit light.

When a scanning signal making the switching thin film transistors 122 in a turn-on state is supplied through the scanning lines 101, the light-emitting device 1 is driven. Accordingly, the switching thin film transistors 122 are turned on. Data signal is supplied through the switching thin film transistors 122 from the data lines 102 and is stored in the storage capacitors cap. The conduction state of the driving thin film transistors 123 is set to be suitable for the amount of charges stored in the storage capacitor cap.

Driving current is supplied to the light-emitting elements 110 through the driving thin film transistors 123, pixel electrodes 111, and the display power source lines 103, and thus the light-emitting elements 110 emit light with the brightness in accordance with the amount of the supplied driving current.

Figure 1:
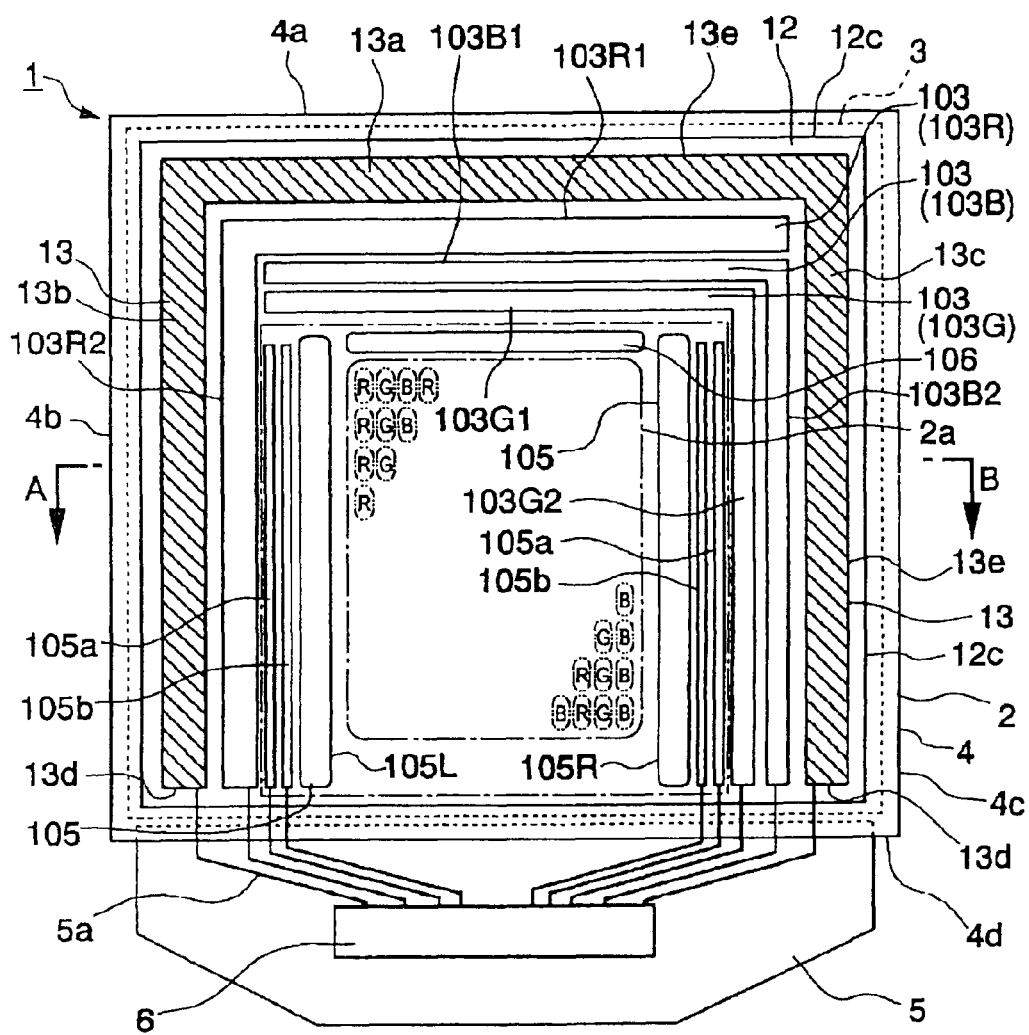
FIG. 1 is a schematic plan view showing an exemplary embodiment of a light-emitting device according to the present invention.

As shown in FIG. 1, a pixel R showing red light emission, a pixel G showing green light emission and a pixel B showing blue light emission are provided corresponding to a display area 2a of the light-emitting device 1. The scanning lines 101

(not shown), the data lines 102 (not shown) and display power source lines 103 (not shown) are provided corresponding to the pixels R, G and B. Though not shown, the display power source lines 103 are connected to first to third power source lines 103G, 103B and 103R outside the display region 2a.

The first power source line 103G is arranged in a L-shaped between two sides 4a and 4c among four sides forming the outer circumference of a circuit board 4 and the display area 2a. The first portion 103G1 of the first power source line 103G is provided between a side 4a facing a side 4d mounted with a flexible substrate 5 and the display area 2a, more specifically, between a test circuit 106 and the side 4a. The first portion 103G1 of the first power source line 103 is extended to the direction from the side 4c to a side 4b which are two sides facing each other among the four sides forming the outer circumference of the circuit board 4. The circuit board 4 is connected to the display power source lines 103 provided in a pixel G in the first portion 103G1.

The second portion 103G2 of the first power source line 103G is extended from the side 4d among the sides mounted with the flexible substrate 5 of the circuit board 4 to the side 4a facing the side 4d. The first portion 103G1 and the second portion 103G2 are connected to each other so that the first power source line is curved.

The second power source line 103B is L-shaped like the first power source line 103G. The second power source line 103B is provided between the two sides 4a and 4c among the four sides forming the outer circumference of the circuit board 4 and the first power source line 103G. The second power source line 103B is connected to the display power source line 103 provided in a pixel B in the first portion 103B1 of the second power source line 103B between the first portion 103G1 of the first power source line 103G and the side 4a.

The third power source line 103R is L-shaped like the first power source line 103G and the second power source line 103B. The first portion 103R1 of the third power source line 103R is provided between the first portion 103B1 of the second power source line 103B and the side 4a facing the side 4d of the sides mounted with the flexible substrate and the facing side 4a among the four sides forming the outer periphery of the circuit board 4. The display power source line 103 provided in a pixel R is connected to the first portion 103R1 of the third power source line 103R.

The second portion 103R2 of the third power source line 103R is formed between the side 4b and the display area 2a. The side 4b is a side facing the side 4c among the sides formed by the second portions 103G2 and 103B2 of the first power source line 103G and the second power source line 103B.

A driving IC 6 is formed on the flexible substrate 5 mounted on the side 4d of the circuit board 4.

A test circuit 106 is provided between the display area 2a and the side 4a. It is possible to examine the qualities and the defects of light-emitting devices by the test circuit 106 during a manufacturing process or shipment process.

Two scanning line driving circuits 105 are provided between the display area 2a and the second portion 103R2 of the third power source line 103R and between the display area 2a and the second portion 103G2 of the first power source line 103G, respectively.

Driving circuit control signal wiring lines 105a to transmit a signal to control the scanning line driving circuit 105 and driving circuit power source wiring lines 105b are provided between the scanning line driving circuit 105 and the second portion 10382 of the third power source line 103R and between the scanning line driving circuit 105 and the second portion 103G2 of the first power source line 103G, respectively.

Cathode wiring lines 13 (counter electrode wiring lines or common electrode wiring lines) connected to a cathode 12 is provided among the third power source line 103R, the second power source line 103B and the three sides 4a, 4b and 4c among the four sides forming the outer circumference of the circuit board 4. The cathode wiring lines are externally U-shaped.

The first portion 13a of the cathode wiring lines 13 is provided between the side 4a facing the side 4d mounted with the flexible substrate 5 of the circuit board 4 and the first portion 103R1 of the third power source line 103R, and is extended along the side 4a. The second portion 13b and the third portion 13c of the cathode wiring lines 13 are arranged along the sides 4b and 4c which are two sides excluding the sides 4a and 4d.

The cathode wiring lines 13 is preferably provided toward inside (the center of the circuit board 4) rather than the outer circumference 12c of the cathode 12.

That is, the outer circumference 13e of the cathode wiring lines 13 (the upper edge of a first portion 13a, the left edge of a second portion 13b and the right edge of a third portion 13c) is preferably positioned in the display area 2a rather than in the outer circumference 12c of the cathode 12.

The distance between the outer circumference 13e of the cathode wiring lines 13 and the outer circumference 12c of the cathode 12 is preferably at least 1 mm (preferably at least 2 mm).

By such a construction, even though an error occurs in the position where the cathode 12 is formed, it is possible to secure an area where the cathode 12 contacts the cathode wiring lines 13 and to let electric resistance in the portion where the cathode 12 is connected to the cathode wiring lines 13 be the desired electric resistance and less.

When the current density of the cathode 12 is not uniform, deterioration of display quality, such as non-uniformity of display, may occur. Therefore, the cathode wiring lines 13 are preferably as wide as possible in order to secure sufficient amount of current. For example, the width of the cathode wiring lines 13 is preferably at least the width of the power source line having the maximum width among the first to third power source lines 103G, 103B and 103R. Furthermore, when the width of the cathode wiring lines 13 is at least the width obtained by adding the widths of the first to third power source lines 103G, 103B and 103R to each other, it is possible to reduce problems, such as non-uniformity in display.

The cathode wiring lines 13 are connected to the driving IC 6 (a driving circuit) on the flexible substrate 5 through a connection wiring lines 5a together with the driving circuit control signal wiring lines 105a, the driving circuit power source wiring lines 105b and the first to third power source line driving circuits 103G, 103B and 103R.

Figure 2:
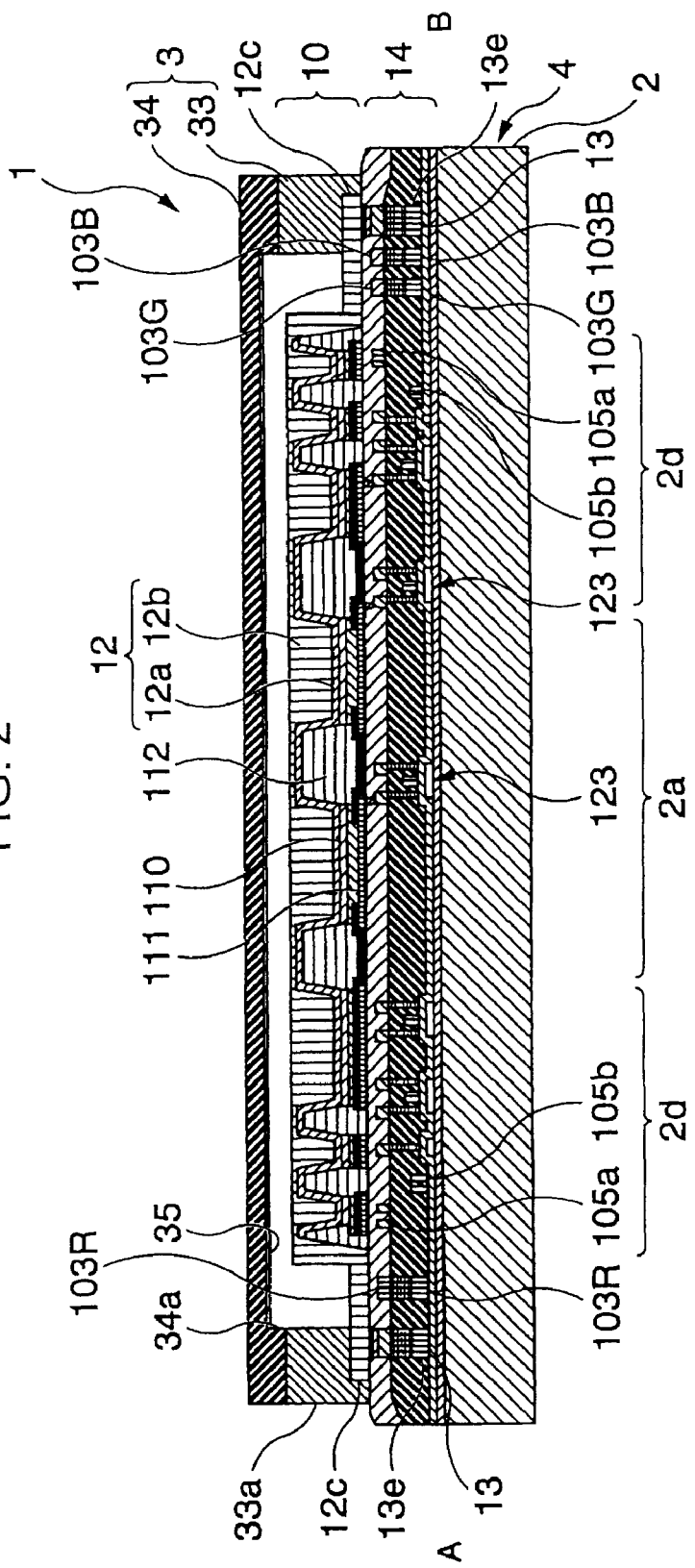
FIG. 2 is a schematic sectional view taken along plane A-B of the light-emitting device shown in FIG. 1.

FIG. 2 is a schematic showing the section of the light-emitting device 1. The light-emitting device includes the circuit board 4 and the electro-optical layer 10 arranged on the circuit board 4.

Figure 3:
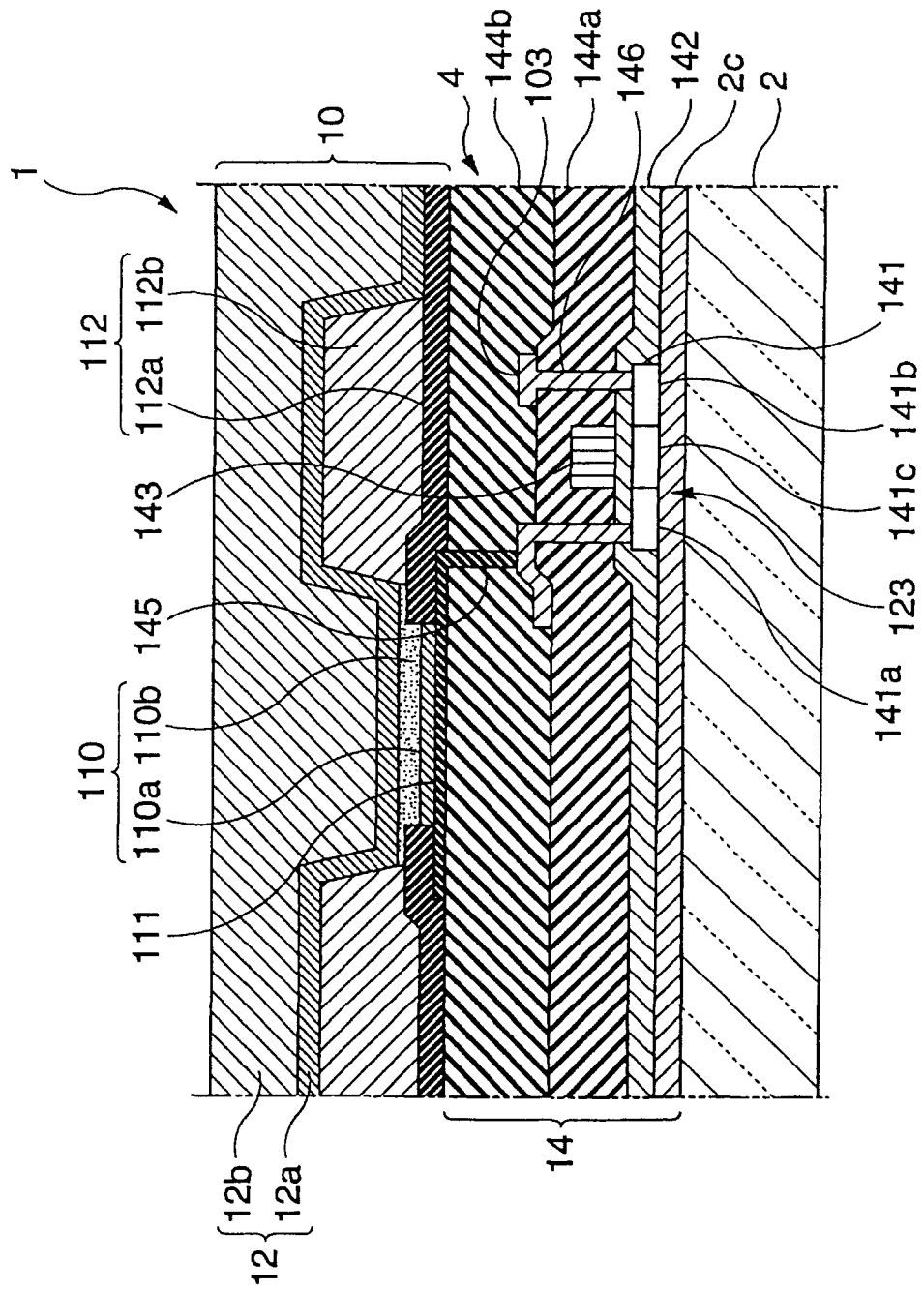
FIG. 3 is a schematic sectional view showing a significant portion of the light-emitting device shown in FIG. 1.

Light-emitting elements 110 are provided in the display area 2a of the electro-optical layer 10. The light-emitting element 110 includes two functional layers, that is, a light-emitting layer 110b and a hole injecting/carrying layer 110a, as shown in FIG. 3.

The light-emitting layer 110b is a functional layer mainly in charge of a light emission phenomenon where the hole injected from the hole injecting/carrying layer 110a is recombined with electrons injected from the cathode 12. In the present exemplary embodiment, the light-emitting layers 110b showing red, green and blue light emitting colors, respectively, in accordance with a pixel R emitting red light, a pixel G emitting green light and a pixel B emitting blue light, as shown in a plan view of the light-emitting device of FIG. 1, is arranged.

The light-emitting layer 110b may be formed of organic-light-emitting material, such as tris (8-quinolinol) and aluminum complex Alq.

The hole injecting/carrying layer 110a to enhance the element characteristics of an element, such as the light emitting efficiency and the life of the light-emitting layer 110b, has a function of injecting hole into the light-emitting layer 110b and transports the hole inside the hole injecting/carrying layer 110a.

The hole injecting/transporting layer 110a is formed of polythiophene derivative, such as polyethylene dihydroxy thiophene, and a mixture, such as polystylene sulfonate.

The light-emitting layer 110b and the hole injecting/carrying layer 110a are arranged between the pixel electrode 111 and the cathode 12 above the pixel electrode 111.

The pixel electrodes 111 are formed of, for example, ITO and are patterned to be almost rectangular in a plane. The thickness of the pixel electrode 111 is preferably between 50 and 200 nm, in particular, about 150 nm.

The cathodes 12 are formed to cover at least the entire surface of the light-emitting elements 11 in the display area 2a, as shown in FIG. 2. In the present exemplary embodiment, the cathode 12 covers a dummy area 2d. The dummy area 2d is used to stabilize the discharge amount of a material of forming the light-emitting element before forming the light-emitting element 110 mainly using an inkjet process. That is, such an area is to perform a test.

The cathode 12 may be single-layered, however, may be multi-layered like the light-emitting device according to the present exemplary embodiment. For example, the cathode 12 may have a structure where a first layer 12a formed of calcium and a second layer 12b formed of aluminum are stacked therein.

It is possible to provide an optical function to either the first layer 12a or the second layer 12b. For example, it is possible to effectively reflect light emitted by the light-emitting element 110 by forming the second layer 12b of aluminum as described above. In this regard, efficiency of extracting light from a base 2 is enhanced.

In the case of extracting light from the cathode 12, it is preferable to make the cathodes 12 thin in order to secure sufficient optical transmittance. In this case, the cathode 12 is preferably formed of a thin-filmed metal including elements such as Ag, Mg, an alloy of Ag and Mg, Pt, Ir, Ni and Pd.

The cathode 12 may be formed by a vapor deposition method, a sputtering method and a chemical vapor deposition (CVD) method.

A protective layer formed of SiO, $SiO_2$ and SiN may be formed on the cathode 12 in order to reduce or prevent invasion and transmission of materials, such as water and oxygen, that deteriorate the cathodes 12, the light-emitting layers 110b and the hole injecting/carrying layers 110a.

The light-emitting layer 110b and the hole injecting/carrying layer 110a are separated from the light-emitting layer 110b and the hole injecting/carrying layer 110a of the light-emitting element 110 adjacent to a bank 112. The bank 112 is formed of a plurality of layers, as shown in FIG. 3. An active element layer 14 is formed by stacking an inorganic bank layer 112a (a first bank layer) and an organic bank layer 112b (a second bank layer) positioned in the cathode 12.

Some of the inorganic bank layer 112a and some of the organic bank layer 112b are formed to overlap the edge of the pixel electrode 111.

The inorganic bank layer 112a is formed more toward the center of the pixel electrode 111 than the organic bank layer 112b.

The inorganic bank layer 112a is preferably formed of inorganic materials such as $SiO_2$ and $TiO_2$. The thickness of the inorganic bank layer 112a is between 50 and 200 nm, in particular, about 150 nm.

The organic bank layer 112b is formed of heat-proof and solvent-proof materials such as acryl resin and polyamide. The thickness of the organic bank layer 112b is preferably between 0.1 and 3.5 μm, in particular, about 2 μm.

A sealing substrate 34 is provided above the electro-optical layer 10 in order to reduce, suppress or prevent the transmission of materials, such as water and oxygen in outside air, which deteriorate the cathodes 12 or the light-emitting elements 110, into the electro-optical layers 10. The sealing substrate 34 is formed of, for example, glass, quartz, a metal and synthetic resin. In the case of extracting the light of the light-emitting element 110 from the cathode 12, the sealing substrate 34 is preferably formed of materials having sufficient optical transmittance, such as glass, quartz and synthetic resin.

A concave portion 34a to receive the electro-optical layer 10 is provided in the electro-optical layer 10 of the sealing substrate 34. It is preferable to arrange a getter 35 to absorb water and oxygen in the concave portion 34a.

The sealing substrate 34 is connected to the circuit board 4 through a sealing resin 33. The sealing resin 33 is preferably formed of materials that attach the sealing substrate 34 to the circuit board 4, furthermore, materials that reduce, suppress or prevent the transmission of materials, such as water and oxygen, which deteriorate the cathodes 12 and the light-emitting elements 110, into the inside of the electro-optical layers 10.

The sealing resin 33 is formed of, for example, thermosetting resin and ultraviolet setting resin. In particular, the sealing resin 33 is preferably formed of epoxy resin which is a kind of the thermosetting resin.

The outer circumference 12c of the cathode 12 is preferably held inside the sealing resin 33 in order to maintain sufficient sealing characteristic. However, in order to narrow a frame, it is preferable that some of the sealing resin 33 overlaps the outer circumference 12c of the cathode 12 and that the cathode 12 is not extended to the outside of the sealing resin 33, as shown in FIG. 2. That is, it is preferable that the cathode 12 does not reach the outer circumference 33a of the sealing resin.

The circuit board 4 includes an active element layer 14. The cathode wiring lines 13, the first to third power source lines 103R, 103G and 103B, the driving circuit control signal wiring lines 105a, the driving circuit power source wiring lines 105b, the data lines 102 (not shown), the scanning lines 101 (not shown), the display power source lines 103 (not shown), the driving thin film transistor 123, the switching thin film transistor 122 (not shown), the thin film transistor 124 included in the scanning line driving circuit 105 provided between the display area 2a and a side forming the outer circumference of the circuit board 4, and a thin film transistor (not shown) for the test circuit 106 are provided in the active element layer 14. The data lines 102 (not shown), the scanning lines 101 (not shown), the display power source lines 103 (not shown), the driving thin film transistor 123, and the switching thin film transistor 122 (not shown) are provided corresponding to the display area 2a, as shown in FIG. 1.

As shown in FIG. 2, the cathode wiring lines 13, the first to third power source lines 103R, 103G and 103B, the thin film transistor 124, the driving circuit control signal wiring lines 105a, the driving circuit power source wiring lines 105b, the data lines 102 (not shown), the scanning lines 101 (not shown), the display power source lines 103 (not shown), the driving thin film transistor 123, and the switching thin film transistor 122 are covered with the cathode 12. The thin film transistor 124, the driving circuit control signal wiring lines 105a, and the driving circuit power source wiring lines 105b are included in the scanning line driving circuit. The data lines 102 (not shown), the scanning lines 101 (not shown), the display power source lines 103 (not shown), the driving thin film transistor 123 and the switching thin film transistor 122, which are provided corresponding to the display area 2a shown in FIG. 1. Although not shown in FIG. 2, the thin film transistor included in the test circuit 106 is preferably covered with the cathode 12.

The cathode wiring lines 13 include a plurality of conductive layers (wiring layers) blocked by a first interlayer insulating film 144a. That is, the cathode wiring lines 13 is formed of the plurality of conductive layers and a conductive material for electrically connecting corresponding the plurality of conductive layers to each other. The cathode wiring lines 13 overlaps the position where the sealing substrate 34 is connected to the circuit board 4. That is, the cathode wiring lines 13 is provided below the sealing resin 33.

As shown in FIG. 2, the cathode wiring lines 13, the first to third power source lines 103R, 103G and 103B, the thin film transistor (not shown), the driving circuit control signal wiring lines 105a, the driving circuit power source wiring lines 105b, the data lines 102 (not shown), the scanning lines 101 (not shown), the display power source lines 103 (not shown), the driving thin film transistor 123, and the switching thin film transistor 122 are covered with the cathode 12. The thin film transistor (not shown), the driving circuit control signal wiring lines 105a, and the driving circuit power source wiring lines 105b are included in the scanning line driving circuit. The data lines 102 (not shown), the scanning lines 101 (not shown), the display power source lines 103 (not shown), the driving thin film transistor 123 and the switching thin film transistor 122, which are provided corresponding to the display area 2a shown in FIG. 1. Although not shown in FIG. 2, the thin film transistor included in the test circuit 106 is preferably covered with the cathode 12.

More specifically, the conductive layer may be formed of Al, Mo, Ta, Ti, W, Cu, TiN and an alloy of Al, Mo, Ta, Ti, W, Cu and TiN.

The first to third power source lines 103G, 103B and 103R are formed of a plurality of conductive layers blocked by the first interlayer insulating film 144a. That is, the first to third power source lines 103G, 103B and 103R are formed of the plurality of conductive layers and a conductive material electrically connecting the corresponding conductive layers to each other.

At least some of at least any one of the first to third power source lines preferably overlaps the position where the sealing substrate 34 is connected to the circuit board 4.

The conductive layer may be formed of the material of forming the scanning lines 101 and/or the material of forming the data lines 102. More specifically, the conductive layer may be formed of Al, Mo, Ta, Ti, W, Cu, TiN and an alloy of Al, Mo, Ta, Ti, W, Cu and TiN.

The driving circuit control signal wiring lines 105a and the driving circuit power source wiring lines 105b are provided on the first interlayer insulating film 144a and are formed on the same layer as the layer of the data lines 102 and/or the layer of the display power source lines 103 or by the same process as the process of forming the data lines 102 and/or the process of forming the display power source lines 103.

The driving circuit control signal wiring lines 105a and the driving circuit power source wiring lines 105b may be formed of employing the same materials as the materials of the first to third power source lines.

The scanning lines 101, the data lines 102 and the display power source lines 103 are provided in the first interlayer insulating film 144a or on the first interlayer insulating film 144a.

The driving thin film transistor 123 includes a semiconductor film 141. A drain area 141a, a source area 141b and a channel area 141c are formed in the semiconductor film 141 by injecting highly concentrated boron ions.

The semiconductor film 141 is formed on a base protective film 2c. The base protective film 2c reduces or suppresses the transmission of materials, such as moving ions, oxygen and water from the base 2, which deteriorate the thin film transistor.

A gate insulating film 142 covering the semiconductor film 141 is formed on the semiconductor film 141. A gate electrode 143 formed of Al, Mo, Ta, Ti and W is formed on the gate insulating film 142. Some of the gate electrode 143 and the gate insulating film 142 are covered with the first interlayer insulating film 144a.

As shown in FIG. 3, contact holes 145 and 146 for connecting drain and source areas 141a and 141b of the semiconductor film 141 to the pixel electrode 111 and the display power source lines 103, respectively, are formed in the first and second interlayer insulating films 144a and 144b.

The drain area 141a is connected to the pixel electrode 111 provided on the second interlayer insulating film 144b through the contact hole 145 formed in the second interlayer insulating film 144b. The source area 141b is connected to the display power source lines 103 through the contact hole 146 formed in the first interlayer insulating film 144a.

It is possible to obtain the following effects by the light-emitting device 1 according to the present exemplary embodiment.

It is possible to secure sufficient area where the cathode wiring lines 13 contacts the cathode 12 and to reduce or minimize electric resistance (contact resistance) between the cathode wiring lines 13 and the cathode 12 because the first to third portions 13a, 13b and 13c of the cathode wiring lines 13 are extended in left to right or up to down direction.

Accordingly, it is possible to reduce or prevent the reduction of the amount of current supplied to the light-emitting element 110 due to voltage drop, which is caused by the electric resistance.

Therefore, it is possible to reduce or prevent the deterioration of brightness, non-uniformity of display and contrast in the light-emitting element 110 and to obtain remarkable display characteristic.

It is possible to significantly reduce the distance between the light-emitting element 110 in any position and the cathode wiring lines 13 because the cathode wiring lines 13 is formed above and below, and on the left and right of the display area 2a so as to surround the display area 2a.

For example, in the light-emitting element 110 positioned above the display area 2a, current that passed through the light-emitting element 110 flows through the first portion 13a. In the light-emitting element 110 positioned below the display area 2a, current flows through the second or third portions 13b or 13c.

Accordingly, it is possible to reduce unbalance in the amount of supplied current due to the position of the light-emitting element 110.

Therefore, it is possible to uniform the brightness of the display area 2a.

Because the cathode wiring lines 13 is provided inside (the center of the substrate) rather than the outer circumference 12c of the cathode 12, even though a little error occurs in the position where the cathode 12 is formed (for example, even though the position where the cathode 12 is formed deviates in up to down or left to right direction), it is possible to form the cathode 12 so as to cover the cathode wiring lines 13.

Accordingly, it is possible to secure sufficient area where the cathode 12 contacts the cathode wiring lines 13. Therefore, it is possible to reduce or prevent the increase of the electric resistance between the cathode 12 and the cathode wiring lines 13 and to reduce or prevent the deterioration of light emitting brightness.

Because the display area 2a, the scanning driving circuit 105, the driving circuit control signal wiring lines 105a, the driving circuit power source wiring lines 105b, the test circuit 106, the first to third power source lines 103G, 103B and 103R and the cathode wiring lines 13 are formed to be covered with the cathode 12, it is possible to reduce or prevent them from being exposed to air. Accordingly, it is possible to prolong period of time where the light-emitting device is used.

Because the display area 2a, the scanning line driving circuit 105 and the test circuit 106 are covered with the cathode 12, it is possible to reduce or prevent the malfunction of the thin film transistors included in the circuits due to light.

It is possible to enhance tolerance of the light-emitting device against static electricity. Charges injected by static electricity can be rapidly removed through the cathode 12.

The cathode wiring lines 13 is arranged more toward the outer circumference of the circuit board 4 than the first to third power source lines 103G, 103B and 103R. The cathode 12 connected to the cathode wiring lines 13 is formed to cover the first to third power source lines 103G, 103B and 103R.

Accordingly, it is possible to form electric capacitance between the cathode 12 and the first to third power source lines 103G, 103B and 103R. Even though the voltages of the first to third power source lines 103G, 103B and 103R change from predetermined values, it is possible to mitigate the change by the corresponding capacitance.

In the light-emitting device 1 shown in FIG. 1 to FIG. 4, the cathode wiring lines 13 is formed of the first to third portions 13a, 13b and 13c in a U-shaped. However, according to the present invention, the shape of the cathode wiring lines is not restricted to such the U-shaped.

In the cathode wiring lines according to the present invention, at least some portion is preferably extended to a predetermined direction. For example, the cathode wiring lines may include any one among the first through third portions 13a, 13b and 13c. The cathode wiring lines may include two among the first to third portions 13a, 13b and 13c.

The cathode wiring lines may be rectangular to have a fourth portion extended horizontally along a lower side 4d below the circuit board 4 further to the first to third portions 13a, 13b and 13c, as shown in FIG. 1.

The shape of the cathode wiring lines is not restricted straight lines. For example, at least some portions of the cathode wiring lines may be formed in curved lines.

According to the above exemplary embodiment, the pixel electrode 111 is an anode. However, even though the pixel electrode 111 is a cathode and the cathode 12 is an anode, it does not deviate from the scope of the present invention.

Figure 5A:
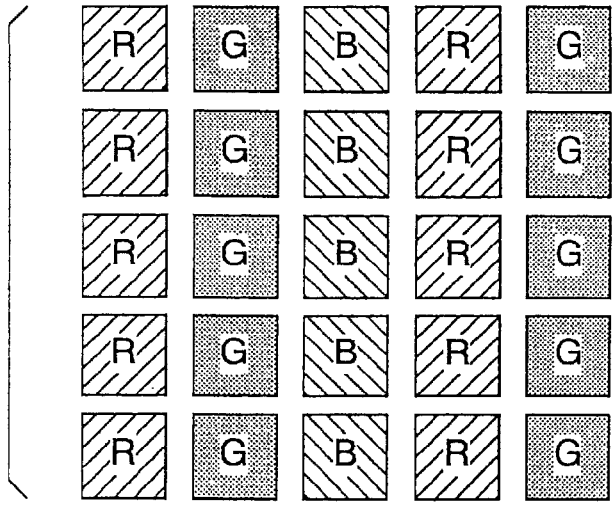
FIGS. 5A-5C are schematic plan views showing the arrangement of a light-emitting layer, where
Figure 5B:
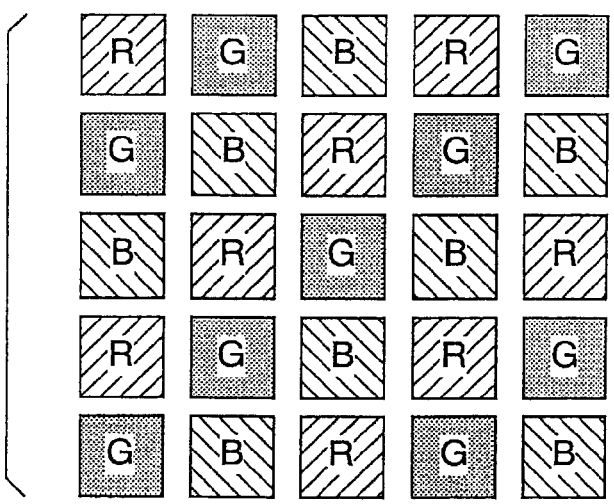
Figure 5C:
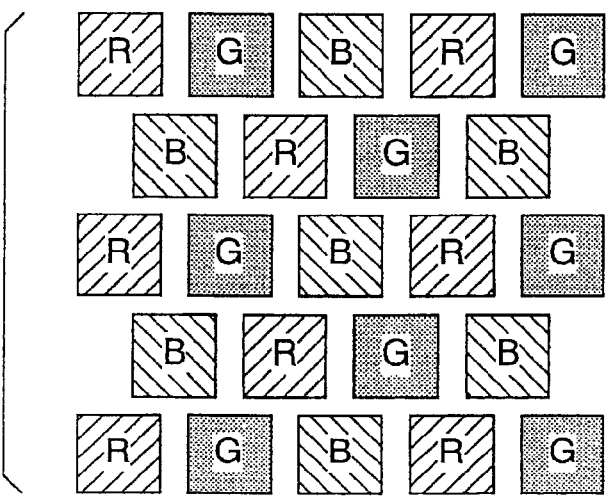

In the light-emitting device 1 shown in FIG. 1 to FIG. 4, the light-emitting elements 110 of the pixel R, the pixel G and the pixel B are arranged in stripe. However, the present invention is not restricted to such stripe arrangement. The light-emitting elements 110 may be arranged to have various arrangements. For example, a mosaic arrangement shown in FIG. 5B and a delta arrangement shown in FIG. 5C can be adopted other than the stripe arrangement shown in FIG. 5A.

A detailed example of an electronic apparatus having the light-emitting device 1 is described below.

Figure 6A:
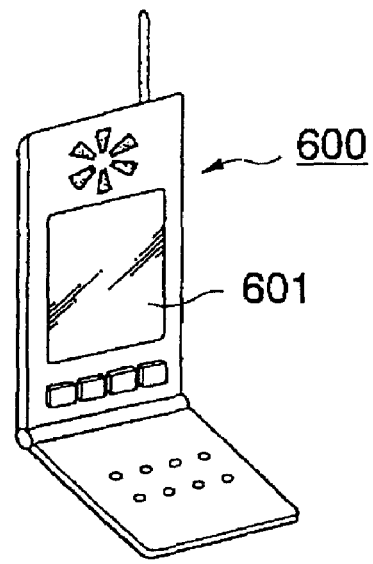
FIGS. 6A-6C are perspective views showing examples of an electronic apparatus using the light-emitting device according to the present invention.

FIG. 6A is a perspective view showing an example of a mobile telephone. In FIG. 6A, reference numeral 600 denotes the main body of a mobile telephone and reference numeral 601 denotes a display unit using the light-emitting device.

Figure 6B:
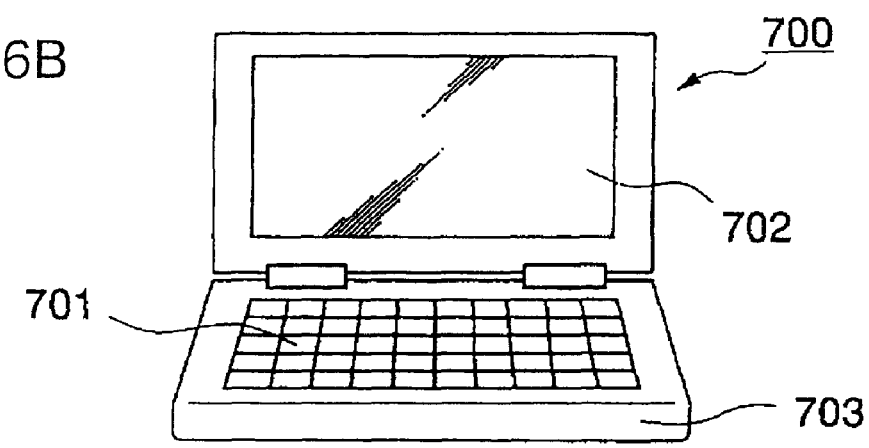

FIG. 6B is a perspective view showing an example of a portable information processing apparatus, such as a word processor and a personal computer (PC), for example. In FIG. 6B, reference numerals 700, 701, 702 and 703 denote an information processing apparatus, an input unit, such as a keyboard, a display unit using the above light-emitting device and the main body of the information processing apparatus, respectively.

Figure 6C:
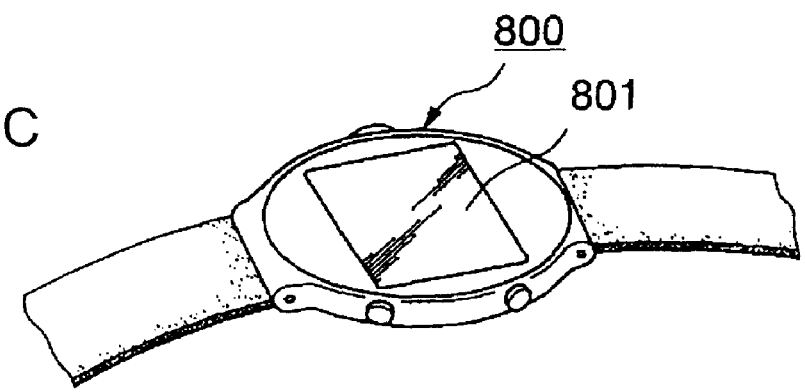

FIG. 6C is a perspective view showing an example of a wrist watch type electronic apparatus. In FIG. 6C, reference numeral 800 denotes the main body of a watch and reference numeral 801 denotes a display unit using the light-emitting device.

The aforementioned electronic apparatus has an excellent display characteristic because the electronic apparatus includes the display using the light-emitting device according to the present invention.

What is claimed is:

1. A light emitting device comprising:
   a base having a main face;
   a pixel electrode disposed above the main face of the base, the pixel electrode being disposed in a display region of the main face which is a region when viewed from a direction perpendicular to the main face;
   a counter electrode that is disposed above the main face opposite to the pixel electrode;
   a light emitting element that is disposed between the pixel electrode and the counter electrode, the light emitting element emitting a light in response to a current;
   a power source line to supply the current to the light emitting element;
   a counter electrode line electrically connected to the counter electrode; and
   a test circuit to detect a defect of the light emitting device, the test circuit being disposed outside of the display region when viewed from a direction perpendicular to the main face, at least a part of the test circuit overlapping with the counter electrode.

2. The light emitting device according to claim 1, the test circuit being positioned between the display region and the counter electrode line when viewed from a direction perpendicular to the main face.

3. The light emitting device according to claim 1, the test circuit being positioned between the display region and the power source line when viewed from a direction perpendicular to the main face.

4. The light emitting device according to claim 1, further comprising:
   a scanning line;
   a data line intersecting the scanning line;
   a driving transistor being electrically connected between the power source line and the pixel electrode; and
   a switching transistor being electrically connected between a gate of the driving transistor and the data line.

5. The light emitting device according to claim 4, the driving transistor controlling a current level of the current supplied to the light emitting element.

* * * * *